United States Patent [19]

Taylor

[11] Patent Number: 5,678,005
[45] Date of Patent: Oct. 14, 1997

[54] CABLE CONNECT ERROR DETECTION SYSTEM

[75] Inventor: Mark A. Taylor, Cupertino, Calif.

[73] Assignee: Tandem Computers Inorporated, Cupertino, Calif.

[21] Appl. No.: 391,320

[22] Filed: Feb. 21, 1995

Related U.S. Application Data

[63] Continuation of Ser. No. 86,715, Jul. 2, 1993, abandoned.
[51] Int. Cl.[6] ................................................. G06F 13/00
[52] U.S. Cl. ......................... 395/200.02; 395/182.07; 395/182.09; 395/200.12; 395/200.15
[58] Field of Search ............................ 395/200, 800, 395/182.02–182.09, 183.01–183.21, 708, 200.02, 200.12, 200.15, 200.16, 280; 371/20.1–20.6; 324/66, 531

[56] References Cited

U.S. PATENT DOCUMENTS

| | | | |
|---|---|---|---|
| 3,246,240 | 4/1966 | Arnold et al. | |
| 4,607,365 | 8/1986 | Greig et al. | 371/37.4 |
| 4,785,453 | 11/1988 | Chandran et al. | 371/51.1 |
| 4,964,120 | 10/1990 | Mostashari | 370/16 |
| 5,091,847 | 2/1992 | Herbermann | 395/182.01 |
| 5,148,433 | 9/1992 | Johnson et al. | 371/11.3 |
| 5,153,874 | 10/1992 | Kohno | 370/13 |
| 5,170,113 | 12/1992 | Albonesi | 324/66 |
| 5,203,004 | 4/1993 | Bunton et al. | 395/800 |
| 5,260,945 | 11/1993 | Rodeheffer | 395/182.02 |
| 5,448,574 | 9/1995 | Yamaguchi | 371/20.1 |

FOREIGN PATENT DOCUMENTS

| | | |
|---|---|---|
| 55-118135 | 9/1980 | Japan. |
| WO84/02015 | 5/1984 | WIPO. |
| WO93/07501 | 4/1993 | WIPO. |

Primary Examiner—Parshotam S. Lall
Assistant Examiner—Saleh Najjar
Attorney, Agent, or Firm—Townsend and Townsend and Crew

[57] ABSTRACT

A digital computer system that contains redundant communication paths between two or more computer components. Each computer component has an interface logic that communicates with other interface logic units to determine if the redundant communication paths are correctly coupled between the components.

19 Claims, 4 Drawing Sheets

CABLE CONNECT ERROR DETECTION SYSTEM

This is a continuation of application Ser. No. 08/086,715, filed Jul. 2, 1993, now abandoned.

The present invention relates generally to a digital computer system. More specifically, the present invention relates to a system that detects cabling errors in a computer system that uses redundant communication paths between computer components.

BACKGROUND OF THE INVENTION

It is often useful to provide redundant communication paths (cables) in a computer system when cables couple one computer component such as a computer processor, an input/output device, or an external memory device to another computer component. The use of redundant communication paths between computer components allows operation of the computer system to go uninterrupted in the instance where one of the cables becomes disconnected.

When redundant cables carrying the redundant communication paths between computer components are implemented in a computer system, it becomes difficult to visually distinguish between the cables and thus it becomes difficult to determine how to correctly connect the cables. Adding to this difficulty is the fact that it is typical for a large percentage of the cable coupling various components to be hidden from view when run through cabling conduit under a floor or above a ceiling. The difficulties in distinguishing between cables results in cables frequently being improperly connected during the setup of computer systems.

It is possible to use cables with different distinguishing features to couple the various computer components together. Features used to distinguish cables could include different colored cables, different colored connectors, different shaped connectors, or identification numbers, among other features. However, in such a scheme, a master list must be kept that details which computer components and which port of each component each cable couples. Additionally, the use of different colored cables or different shaped or colored cable connectors requires distinguishing part numbers, and thus complicates inventory and set-up procedures.

SUMMARY OF THE INVENTION

The present invention solves the above-described problems by providing a system that detects whether cables are incorrectly connected between computer components without requiring cables or cable connectors that physically differ from one another.

One aspect of the present invention is to provide a computer system that is able to detect (1) when a cable from a computer component is disconnected, (2) when a cable is connected to an incorrect redundant port of the correct computer component, and (3) when a cable is coupled to an incorrect computer component.

More specifically, the present invention provides for a first computer component with interface logic that includes a cable detect signal generator for generating a cable detect signal, a component address signal generator for generating a component section address signal, a component slice identification signal generator for generating a component slice identification signal, and a remote connection indicator signal receiver for receiving a remote connection indicator signal.

A further aspect of the present invention provides for a second computer component that has an interface logic that includes a cable detect signal receiver for receiving the cable detect signal, a component address signal receiver for receiving the component section address signal, a component slice identification signal receiver for receiving the component slice identification signal, and remote connection indicator signal generator for generating the remote connection indicator signal.

A still further aspect of the present invention provides for third and fourth computer components. The third computer component having interface logic that includes a second cable detect signal generator for generating a second cable detect signal, a second component address signal generator for generating a second component section address signal, a second component slice identification signal generator for generating a second component slice identification signal, and a second signal receiver for receiving a second remote connect indicator signal. The fourth computer component having interface logic that includes a second cable detect signal receiver for receiving the second cable detect signal, a second component address signal receiver for receiving the second component section address signal, a second component slice identification signal receiver for receiving the second component slice identification signal, and a second remote connection indicator signal generator for generating a second remote connection indicator signal.

According to a still further aspect of the present invention, the first and third computer components further include parity generators for generating parity signals, and the second and fourth computer components further include parity verifiers to check if parity is correct.

DESCRIPTION OF THE ONE EMBODIMENT

Table of Contents

I. CONFIGURATION
 A. X Master Interface Logic (XMIL)
 B. X Target Interface Logic (XTIL)
 C. Connection of XMIL to XTIL
 D. Y Master Interface Logic (YMIL)
 E. Y Target Interface Logic (YTIL)
 F. Connection of YMIL to YTIL
II. DETAILED OPERATION
 A. Detection of a Missing Cable
 B. Detection of a Crossed X or Y Cable
 C. Detection of Cables Crossed Between Different Processing Sections
 D. Parity Signal Verification
 E. No Cabling Error
 F. Operation of Processing Sections 9 and 12

I. CONFIGURATION

Figure 1:
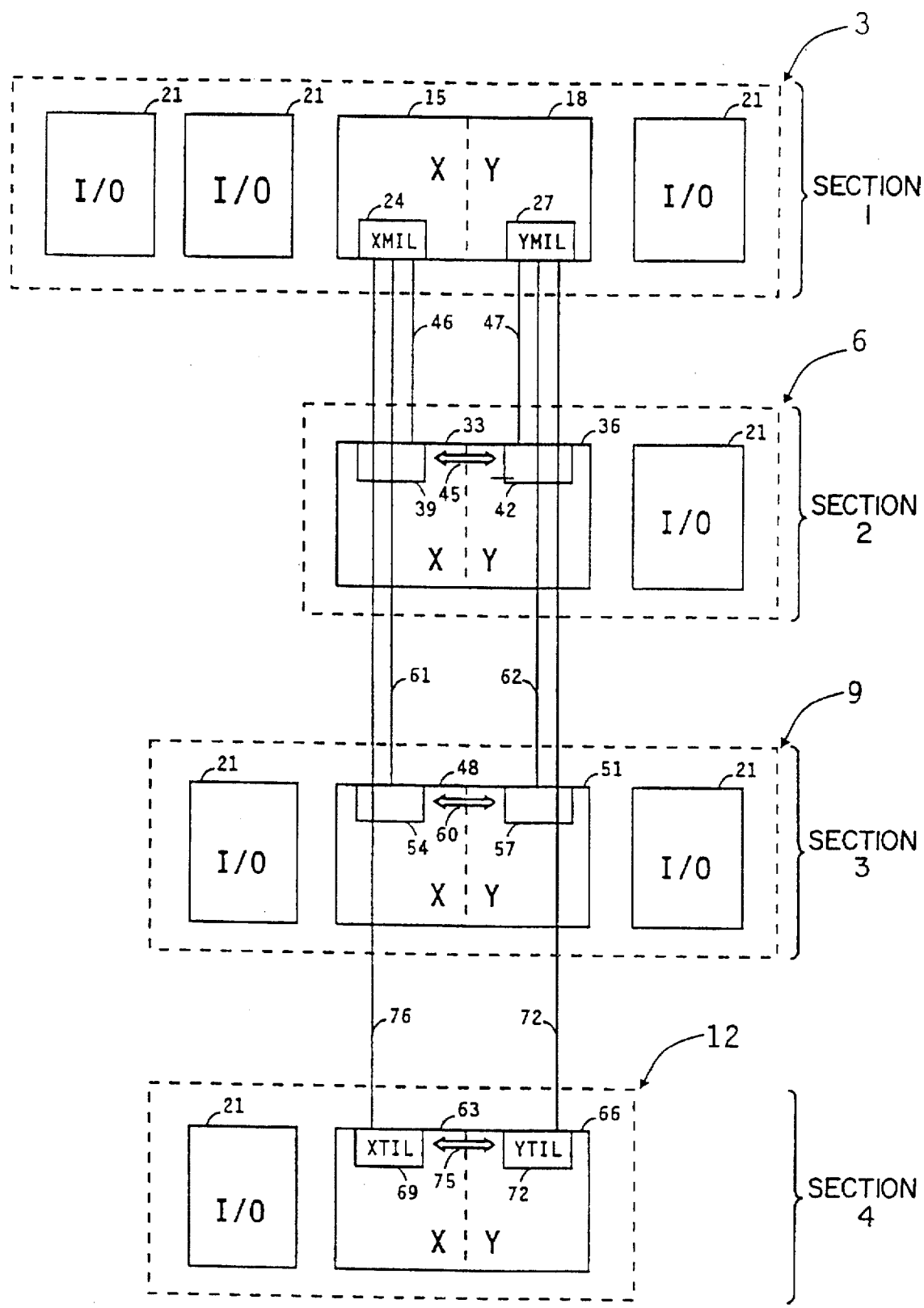
FIG. 1 is a block diagram showing one embodiment of a computer system according to the present invention.

FIG. 1 is a block diagram showing one embodiment of a computer system according to the present invention. The computer system shown in FIG. 1 comprises a first computer processing section 3, a second computer processing section 6, a third computer processing section 9, and a fourth computer processing section 12.

First computer processing section 3 comprises redundant computer processing slices 15 and 18, labelled X and Y, respectively, and input/output devices 21. Redundant computer processing slices 15 and 18 are separate computer processors that perform redundant computer operations so that if either processing slice fails, the operation of first processing section 3 can be continued by a nonfailing processing slice. Input/output devices 21 are coupled to processing slices 15 and 18 by communication paths not shown and perform various input and output operations.

Processing slice 15 comprises X master interface logic (XMIL) 24. Processing slice 18 comprises Y master interface logic (YMIL) 27. XMIL 24 and YMIL 27 are coupled to other elements of processing slices 15 and 18, respectively, by communication paths not shown.

Second computer processing section 6 comprises redundant computer processing slices 33 and 36, labelled X and Y, respectively, and input/output device 21. Redundant computer processing slices 33 and 36 are seperate computer processors that perform redundant computer operations so that if either processing slice fails, the operation of second computer processing section 6 can be continued by the nonfailing processing slice. Input/output device 21 is coupled to processing slices 33 and 36 by communication paths not shown and performs various input and output operations.

Processing slice 33 comprises X target interface logic (XTIL) 39. Processing slice 36 comprises Y target interface logic (YTIL) 36. XTIL 39 and YTIL 42 are coupled to each other by communication path 45. XTIL 39 and YTIL 42 are coupled to other elements of processing slices 33 and 36, respectively, by communication paths not shown.

Cable 46 couples X processing slice 15 to X processing slice 33 through XMIL 24 and XTIL 39, respectively. Cable 47 couples Y processing slice 18 to Y processing slice 36 through YMIL 27 and YTIL 42, respectively.

Third computer processing section 9 comprises redundant computer processing slices 48 and 51, labelled X and Y, respectively, and input/output devices 21. Redundant computer processing slices 48 and 51 are seperate computer processors that perform redundant computer operations so that if either processing slice fails, the operation of third computer processing section 9 can be continued by the nonfailing processing slice. Input/output devices 21 are coupled to processing slices 48 and 51 by communication paths not shown and perform various input and output operations.

Processing slice 48 comprises X target interface logic (XTIL) 54. Processing slice 51 comprises Y target interface logic (YTIL) 57. XTIL 54 and YTIL 57 are coupled to each other by communication path 60. XTIL 54 and YTIL 57 are coupled to other elements of processing slices 48 and 51, respectively, by communication paths not shown.

Cable 61 couples X processing slice 15 to X processing slice 48 through XTIL 54 and XMIL 24, respectively. Cable 62 couples Y processing slice 18 to Y processing slice 51 through YTIL 57 and YMIL 27, respectively.

Fourth computer processing section 12 comprises redundant computer processing slices 63 and 66, labelled X and Y, respectively, and input/output device 21. Redundant computer processing slices 63 and 66 are seperate computer processors that perform redundant computer operations so that if either processing slice fails, the operation of fourth computer processing section 12 can be continued by the nonfailing processing slice. Input/output device 21 is coupled to processing slices 63 and 66 by communication paths not shown and performs various input and output operations.

Processing slice 63 comprises X target interface logic (XTIL) 69. Processing slice 66 comprises Y target interface logic (YTIL) 72. XTIL 69 and YTIL 72 are coupled to each other by communication path 75. XTIL 69 and YTIL 72 are coupled to other elements of processing slices 63 and 66, respectively, by communication paths not shown.

Cable 76 couples X processing slice 15 to X processing slice 63 through XTIL 69 and XMIL 24, respectively. Cable 77 couples Y processing slice 18 to Y processing slice 66 through YTIL 72 and YMIL 27, respectively.

A. X Master Interface Logic 24

Figure 2:
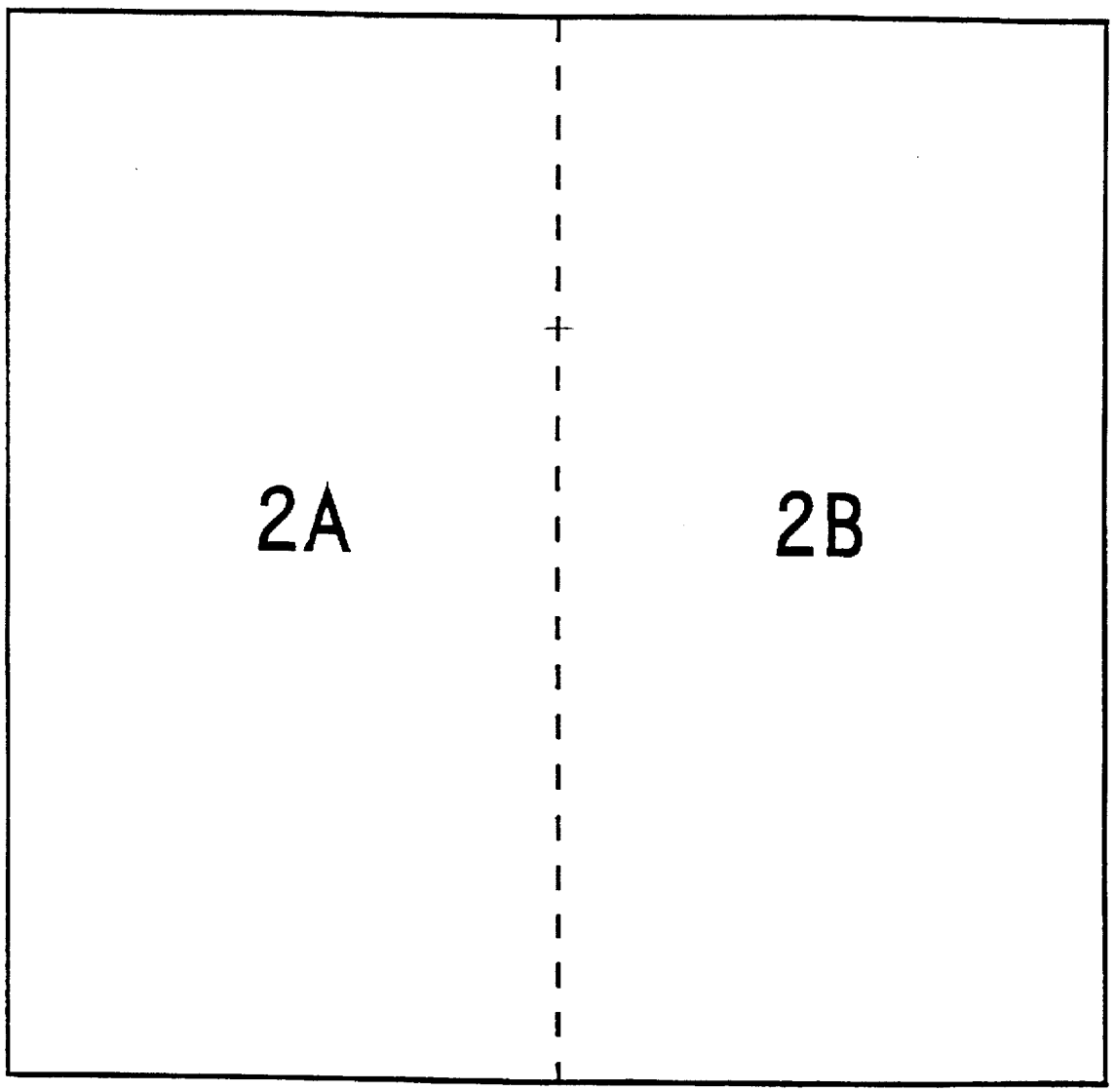
FIG. 2 is a diagram showing the relationship of FIG. 2A to FIG. 2B.
Figure 2A:
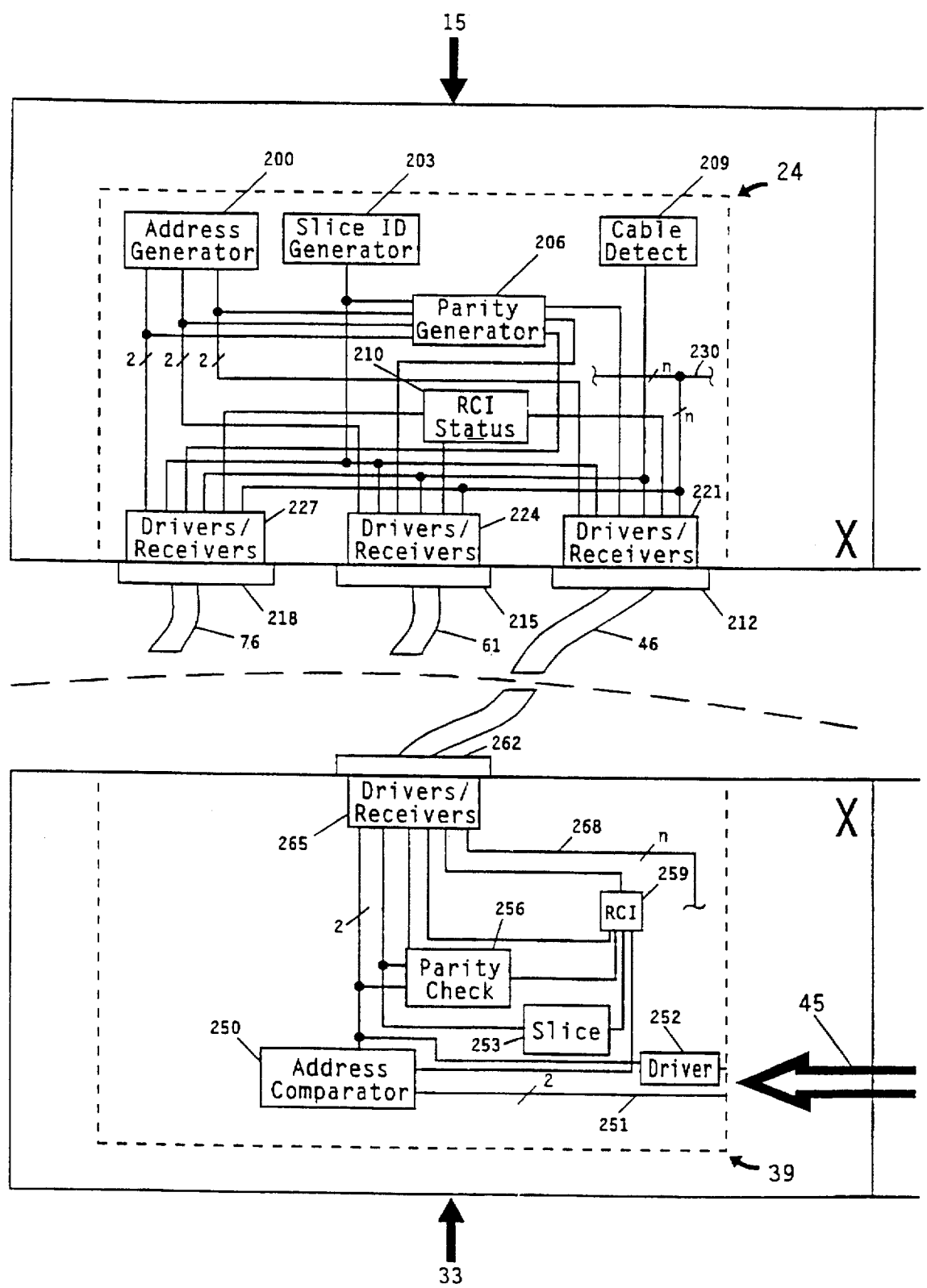
FIGS. 2A and 2B are block diagrams of one embodiment of the master interface logic units and target interface logic units of the computer system shown in FIG. 1.
Figure 2B:
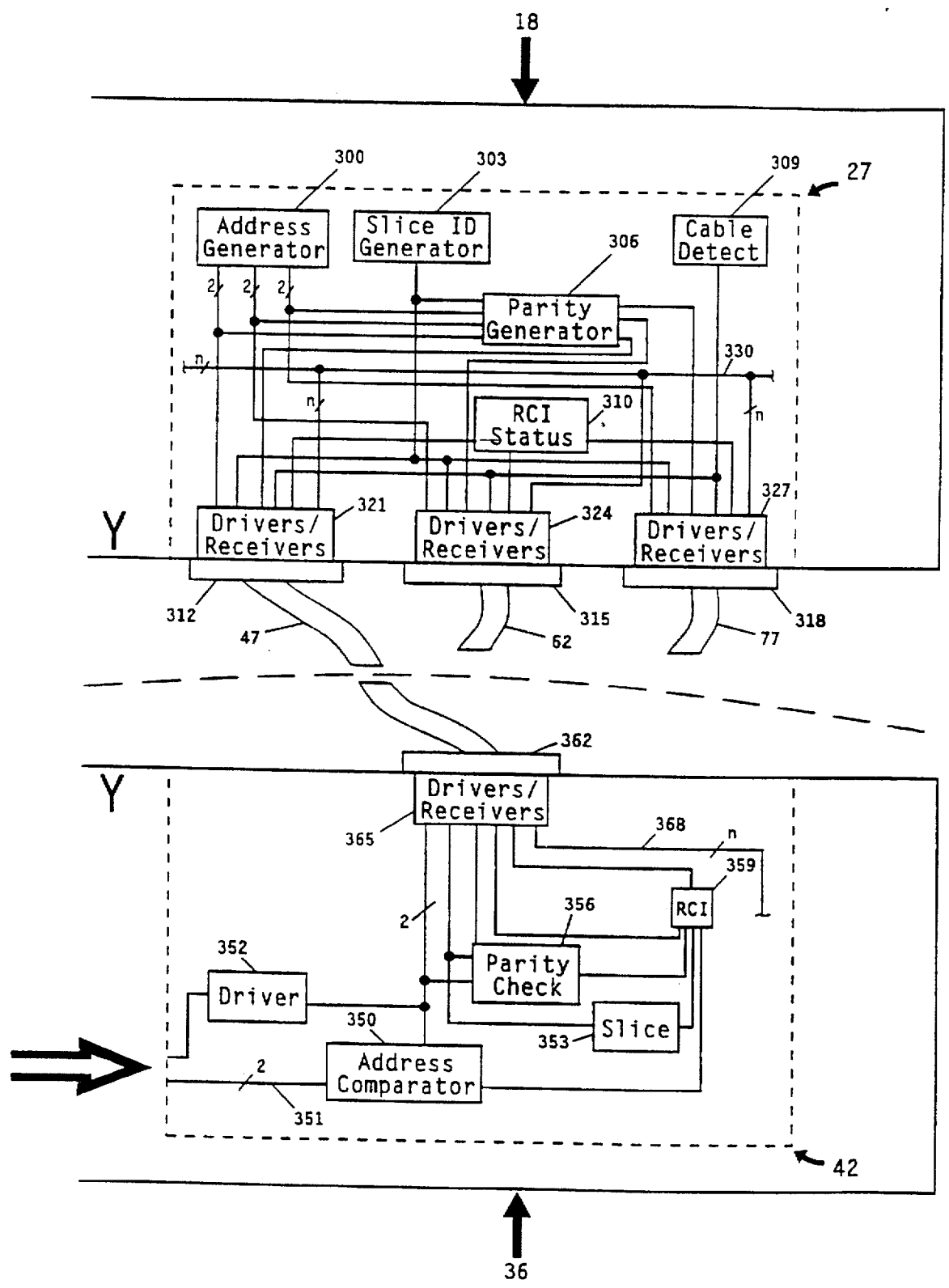

FIG. 2 is a block diagram of one embodiment of master interface logic XMIL 24 and YMIL 27 and target interface logic XTIL 39 and YTIL 42 of the computer system shown in FIG. 1. For convenience, the same reference numerals used in FIG. 1 are used in FIG. 2 to refer to like elements.

XMIL 24 comprises a section address generator 200 for generating section addresses for computer processing sections 6, 9, and 12, a slice identification signal generator 203 for generating a processing slice identification signal, a parity signal generator 206 for generating a parity signal, a cable detect signal generator 209 for generating a cable detect signal, and a remote connection indicator (RCI) signal status logic 210 for communicating to XMIL if cables 46, 61, and 76 are properly coupled. XMIL 24 has a first port 212, a second port 215, and a third port 218 into which cables 46, 61, and 76, respectively, are connected. Output port 212 is coupled to a signal driver/receiver 221, which drives and receives signals as appropriate through port 212. Output ports 215 and 218 are coupled to similar signal driver/receivers 224 and 227, respectively.

Address generator 200 has three two-bit outputs, a first output is coupled to a first input of signal driver/receiver 221 of first port 212, a second output is coupled to a first input of signal driver/receiver 224 of second port 215, and a third output is coupled to a first input of signal driver/receiver 227 of third port 218. Each two-bit output of address generator 200 is also coupled to a corresponding input of parity signal generator 206.

An output of slice identification signal generator 203 is coupled to a second input of each of signal driver/receivers 221, 224, and 227. The output of slice identification signal generator 203 is also coupled to an input of parity signal generator 206. Parity signal generator 206 has three outputs: a first output is coupled to a third input of signal driver/receiver 221 of first port 212, a second output is coupled to a third input signal driver/receiver 224 of second port 215, and a third output is coupled to an input signal driver/receiver 227 of third port 218.

Cable detect signal generator 209 has an output coupled to a fourth input of each signal driver/receivers 221, 224, and 227 of ports 212, 215, and 218, respectively. RCI signal status logic 210 has an input coupled to an output of each signal driver/receivers 221, 224, and 227. An n-bit data bus 230 is also coupled to each of signal driver/receivers 221, 224, and 227.

B. X Target Interface Logic 39

XTIL 39 comprises a section address verifier 250, a traded section number driver 252, a processing slice verifier 253, a parity verifier 256, and an RCI signal generator 259 for generating an RCI signal. XTIL 39 also has a signal driver/receiver 265 which is coupled to a port 262.

An input of section address comparator 250 is coupled to a first two-bit output of signal driver/receiver 265 to receive the address signal transmitted over cable 46. A second input of section address comparator 250 is coupled to a two-bit traded section number bus 251 which is one of a plurality of lines from communication path 45. Section address comparator 250 has an output coupled to a first input of RCI signal generator 259. Traded section number driver 252 is coupled at an input to the first two-bit output signal of signal driver/receiver 265 to receive the address signal transmitted over cable 46 and has an output coupled to communication path 45.

Processing slice verifier 253 is coupled at an input to receive the slice identification signal transmitted over cable 46 to a second output of signal driver/receiver 265. Processing slice verifier 253 also has an output coupled to a second input of RCI signal generator 259. Parity verifier 256 has a first input coupled to a third output of signal driver/receiver 265 to receive the parity signal transmitted over cable 46. A second input of parity verifier 256 receives the address signal transmitted over cable 46, while a third input receives the slice identification signal transmitted over cable 46. An output of parity verifier 256 is coupled to a third input of RCI signal generator 259. A fourth output of signal driver/receiver 265 representing the cable detect signal transmitted over cable 46 is coupled to a fourth input of RCI signal generator 259. The output of RCI signal generator 259 is coupled to an input of signal driver/receiver 265. Signal driver/receiver 265 is also coupled to an n-bit data bus 268.

C. Connection of XMIL 24 to XTIL 39

Cable 46 couples port 212 of XMIL 24 to port 262 of XTIL 39. Cable 46 comprises a plurality of communication paths not shown that transmit the following signals generated by respective signal generators described above: the section address signal, the processing slice identification signal, the parity signal, the cable detect signal, and the remote connection indication signal. Additionally, cable 46 comprises a communication path (data bus) not shown that transmits n-bit data signals between XMIL 24 and XTIL 39.

D. Y Master Interface Logic 27

YMIL 27 comprises a section address generator 300 for generating addresses for computer processing sections 6, 9, and 12, a slice signal generator 303 for generating a processing slice identification signal, a parity signal generator 306 for generating a parity signal, a cable detect signal generator 309 for generating a cable detect signal, and a RCI signal status logic 310 for communicating to XMIL if cables 46, 61, and 76 are properly coupled. YMIL 27 has a first port 312, a second port 315, and a third port 318 into which cables 47, 62, and 77, respectively, are connected. Output port 312 is coupled to a signal driver/receiver 321, which drives and receives signals a appropriate through port 312. Output ports 315 and 318 are coupled to similar signal driver/receivers 324 and 327, respectively.

Address generator 300 has three two-bit outputs, a first output is coupled to a first input of signal driver/receiver 321 of first port 312, a second output is coupled to a first input of signal driver/receiver 324 of second port 315, and a third output is coupled to a first input of signal driver/receiver 327 of third port 318. Each two-bit output of address generator 300 is also coupled to a corresponding input of parity signal generator 306.

An output of slice signal generator 303 is coupled to a second input of each signal driver/receivers 321, 324, and 327 of ports 312, 315, and 318, respectively. The output of slice signal generator 303 is also coupled to an input of parity signal generator 306. Parity signal generator 306 produces three outputs: a first output is coupled to a third input of signal driver/receiver 321 of first port 312, a second output is coupled to a third input of signal driver/receiver 324 of second port 315, and a third output is coupled to a third input of signal driver/receiver 327 of third port 318.

Cable detect signal generator 309 has an output coupled to a fourth input of each of signal driver/receivers 321, 324, and 327. RCI signal status logic 310 is coupled at an input to an output of each of signal driver/receivers 321, 324, and 327, and an n-bit data bus 330 is also coupled to each of signal driver/receivers 321, 324, and 327.

E. Y Target Interface Logic 42

YTIL 42 comprises a section address verifier 350, a traded section number driver 352, a slice verifier 353, a parity verifier 356, and an RCI signal generator 359 for generating an RCI signal. YTIL 42 also has a signal driver/receiver 365 coupled to a port 362.

An input of section address comparator 350 is coupled to a first two-bit output of signal driver/receiver 365 to receive the address signal transmitted over cable 47. A second input of section address comparator 350 is coupled to a two-bit traded section number bus 351 which is one of a plurality of lines on communication path 45. Section address comparator 350 has an output coupled to a first input of RCI signal generator 359. Traded section number driver 352 is coupled at an input to the first two-bit output signal of signal driver/receiver 365 to receive the address signal transmitted over cable 47 and has an output coupled to communication path 45.

Processing verifier 353 is coupled at an input to receive the slice identification signal transmitted over cable 47 to a second output of signal driver/receiver 365. Processing slice verifier 353 also has an output coupled to a second input of RCI signal generator 359. Parity verifier 356 has an input coupled to a third output of signal driver/receiver 365 to receive the parity signal transmitted over cable 47. A second input of parity verifier 356 receives the address signal transmitted over cable 47, while a third input receives the slice identification signal transmitted over cable 47. An output of parity verifier 356 is coupled to a third input of RCI signal generator 359. A fourth output of signal driver/receiver 365 representing the cable detect signal transmitted over cable 47 is coupled to a fourth input of RCI signal generator 359. The output of RCI signal generator 359 is coupled to an input of signal driver/receiver 365. Signal driver/receiver 365 is also coupled to an n-bit data bus 381.

F. Connection of YMIL 27 to YTIL 42

Cable 47 couples port 312 of YMIL 27 to port 362 of YTIL 42. Cable 47 comprises a plurality of communication paths not shown that transmit the following signals generated by respective signal generators described above: the section address signal, the processing slice identification signal, the parity signal, the cable detect signal, and the remote connection indication signal. Additionally, cable 47 comprises a communication path (data bus) not shown that transmits n-bit data signals between YMIL 27 and YTIL 42.

II. DETAILED OPERATION

In operation, XMIL 24, YMIL 27, XTIL 39, and YTIL 42 communicate with each other to determine if cables 46 and 47, which provide redundant communication paths between the processors of first processing section 3 and second processing section 6, are properly connected. A cable properly couples a target processing slice, i.e., a processing slice comprising an X or Y TIL, to first processing section 3 when it is connected to the target processing slice from the proper port of first processing section 3.

Each of ports 212, 215, 218, 312, 315, and 318 of first processing section 3 represents a unique address and slice combination, which is used to identify individual target processing slices. The address of each port is generated by either address generator 200 or 300. Address generator 200 generates permanent addresses for ports 212, 215, and 218. Port 212 is given the binary address 01, port 215 is address 10, and port 218 is address 11. Similarly, address generator 300 generates permanent addresses for ports 312, 315, and 318. Port 312 is given the binary address 01, port 315 is address 10, and port 318 is address 11. Each port is coupled to the appropriate address generator by a two-bit address signal line.

Since the addresses are permanent, the ports are actually hardwired to represent their particular addresses. Cables coupled to each port carry the two-bit address signal from the port to a target processing slice, thus assigning that target processing slice the address of the port it is coupled to. One of the requirements for target processing sections 6, 9, and 12 to be properly cabled is that both their X and Y processing slices are assigned identical addresses.

The other identification signal sent to each target processing slice is the slice identification signal generated by slice identification signal generators 203 and 303. Slice identification signal generator 203 generates a permanent asserted slice signal that indicates ports 212, 215, and 218 should be coupled to X target processing slices. Slice identification signal generator 303 generates a permanent deasserted slice signal that indicates ports 312, 315, and 318 should be coupled to Y target processing slices.

The identification of incorrect cabling schemes is dependent on two signals: (1) the cable detect signals generated by cable detectors 209 and 309 and driven from first section 3 to each of processing sections 6, 9, and 12, and (2) the RCI signals generated by RCI signal generators 259 and 359 in response to the address, slice, parity, and cable detect signals and driven from each target processing slice to first processing section 3. These two signals allow the following cable miswiring scenarios to be detected: (1) a cable is disconnected from one of ports 212, 215, 218, 262, 312, 315, 318, or 362; (2) a cable from X processing slice 15 is coupled to a Y target processing slice or a cable from Y processing slice 18 is coupled to an X target processing slice; or (3) the X and Y processing slices of a single processing section 6, 9, or 12 are given conflicting addresses because their X and Y cables are not coupled to the correct pair of ports in first processing section 3.

A. Detection of a Missing Cable

Cable detect generators 209 and 309 continuously assert cable detect signals which are driven by each of driver/receivers 221, 224, 227, 321, 324, and 327 over cables 46, 61, 76, 47, 62, and 77, respectively. The method in which each target processing slice receives the asserted cable detect signal and determines if a cable is properly connected to its port is identical, so only the operation of driver/receiver 265 in XTIL 39 is discussed.

By default, driver/receiver 265 biases the cable detect signal to FALSE so that XTIL 39 knows a problem exists if an asserted (TRUE) cable detect signal is not received. If the received cable detect signal is not asserted, processing slice 33 will not drive its local data and traded section number buses. Additionally, the detection of a faulty cable connection means that a FALSE signal is input to RCI signal generator 259 and a FALSE RCI signal, which signifies to XMIL 24 that XTIL 39 is not correctly configured, is output from RCI signal generator 259.

When cable 46 is disconnected from either XMIL 24 or XTIL 39, however, XMIL 24 does not receive the FALSE RCI signal driven from RCI signal generator 259. Instead, a receiver in driver/receiver 212 is biased to FALSE, so that when a TRUE RCI signal is not received, the receiver outputs a FALSE signal to RCI signal status logic 210, which communicates to X processing slice 15 the improper cable connection.

B. Detection of a Crossed X or Y Cable

Slice signal verifiers 253 and 353 check the received slice ID signal in XTIL 39 and YTIL 42, respectively, to determine if a cable is crossed and coupled to the wrong target processing slice. Slice signal verifier 253 compares the slice signal received at driver/receiver 265 to see if an asserted slice identification signal representing a cable from X processing slice 15 is received. If the slice identification signal received is not asserted, XTIL 39 is incorrectly coupled to one of the ports from Y processing slice 18. Logic, not shown, within XTIL 39 ensures that XTIL 39 still drives its local data and traded section number buses, but slice signal verifier 253 outputs a FALSE signal, which indicates an error to RCI signal generator 259.

RCI signal generator 259 then outputs a FALSE RCI signal that communicates to first processing section 3 that XTIL 39 is not correctly configured. When the cables are improperly crossed, XTIL 39 is coupled to one of ports 312, 315, or 318, and the FALSE RCI signal is received by an appropriate receiver in the respective port. A FALSE signal is then sent to RCI signal status logic 310, which communicates the improper cable connection to Y processing slice 18.

The operation of slice signal verifier 353 is identical to that of slice signal verifier 253 except that a deasserted slice identification signal representing a cable from Y processing slice 18 is expected.

C. Detection of Cables Crossed Between Different Processing Sections

The various processing sections 6, 9, and 12 are each given a unique address by first processing section 3. The address of each processing section 6, 9, and 12 depends on which set of ports the redundant processing slices of the particular section are coupled to. As described above, address generator 200 generates address signals that give addresses to ports 212, 215, and 218. Each generated address is 2 bits which allows first processing section 3 to have an address and three different addresses to be given to processing sections 6, 9, and 12.

The actual address given to each processing section is unimportant and can even be arbitrary. However, it is important that each redundant processing slice in a processing section be given the same address. Additionally, the manner in which the address of each computer processing slice in each processing section is verified is identical, and thus, only the manner in which the address given to X processing slice 33 is verified is set forth below.

The address is sent from address generator 200 through driver/receiver 212 over cable 46. The address is received at driver/receiver 265. The address given to X processing slice 33 is sent to a first input of address comparator 250. At a second input, address comparator 250 also receives from traded section number bus 251, which is connected to YTIL 42 by communication path 45, the address sent to Y processing slice 36.

The two addresses input to address comparator 250 are compared and an output signal is generated indicative of the comparison. If the addresses match, the output signal is TRUE. If the addresses do not match, the output signal is FALSE, but logic, not shown, within XTIL 39 ensures that XTIL 39 still drives its local data and traded section number buses.

Additionally, a FALSE output signal from address comparator 250 results in a FALSE RCI signal output from RCI signal generator 259 to XMIL 24. The FALSE RCI signal is received by a receiver at the driver/receiver 221, 224, or 227 depending on which port XTIL 39 is incorrectly coupled to, and the receiver sends a FALSE signal to RCI signal status logic 210. RCI signal status logic 210 then communicates to XMIL 24 that XTIL 39 is not correctly cabled.

When the cable connecting processing slice 36 is disconnected, processing slice 36 does not drive its internal address traded section number bus. When no section address is received by address comparator 250 over traded section number bus 251, the traded section address defaults to 00 and a comparison of addresses is not made. In this instance, a TRUE signal is always output to RCI signal generator 259. Not comparing addresses when the address defaults to 00 allows a single target interface logic to drive the data and target section address buses if its redundant target interface logic is being repaired, replaced, or is disconnected.

D. Parity Signal Verification

Parity signal generator 206 generates signals that place even parity at each of ports 212, 215, and 218 across the address signals generated from address generator 200 and the slice identification signals generated from slice identification signal generator 203. Parity checker 256 than verifies that even parity is maintained across the two-bit address signal and the slice identification signal after the signals are transmitted across cable 46. If even parity is not maintained, parity checker 256 outputs a FALSE signal to RCI signal generator 259, and logic, not shown, internal to XTIL 39 ensures that the local data and traded section number buses of XTIL 39 are not driven.

The FALSE signal output from RCI signal generator 259 is also received at a receiver in driver/receiver 212. The receiver then sends a FALSE signal to RCI signal status logic 210 which communicates to X processing slice 15 that an error has occurred.

The operation of parity signal generator 306 and parity checker 356 is identical to that of parity signal generator 206 and parity checker 256.

E. No Cabling Error

If the output signals of address comparator 250, slice signal verifier 253, and parity checker 256, and the cable detect signal received at driver/receiver 265 are all asserted (TRUE) than the output of RCI signal generator 259 is asserted and XTIL 39 drives its internal traded section number and data buses. The asserted RCI signal is received by driver/receiver 212 and sent to RCI signal status logic 210. RCI signal status logic 210 communicates, by communication paths not shown, to X processing slice 15 that XMIL 24 is correctly coupled to XTIL 39 allowing X processing slice 15 to take appropriate action.

Similarly, RCI signal generator 359 asserts an RCI output signal when the output signals of address comparator 350, slice signal verifier 353, and parity checker 356, and the cable detect signal received at driver/receiver 365 are all asserted (TRUE). The asserted RCI signal is received by driver/receiver 312 and sent to RCI signal status logic 310. RCI signal status logic 310 communicates, by communication paths not shown, to Y processing slice 18 that YMIL 27 is correctly coupled to YTIL 42 allowing Y processing slice 18 to take appropriate action.

F. Operation of Processing Sections 9 and 12

The operation of XTILs 54 and 69 in processing sections 9 and 12, respectively, are identical to the operation of XTIL 39 of processing section 6. Additionally, the operation of YTILs 57 and 72 in processing sections 9 and 12, respectively, are identical to the operation of YTIL 42 in processing section 6.

Having fully described one embodiment of the present invention, many other equivalent or alternative methods of implementing the cross-cabling detection system will be apparent to those skilled in the art. For example, the present invention is not intended to be limited to either multiprocessor or redundant processor environments. The system can be used for any application in which computer components are coupled by redundant communication paths.

Also, three or more redundant communication paths (e.g.: X, Y, and Z) can be coupled between computer components as long as the bit size of the slice ID signal lines is changed accordingly. All signals can be transmitted between processing sections using single line or differential line protocols.

Additionally, other embodiments can vary the number of computer processing sections coupled to first processing section 3 from zero to any number N with the bit size of the address lines changing accordingly. Each processing section may have a variable number of input/output devices 21.

Still more embodiments may include various portions of XMIL 24 and YMIL 27, such as address generators 200 and 300, parity generators 206 and 306, cable detectors 209 and 309, RCI status logic units 210 and 310, and drivers/receivers 212, 215, 218, 312, 315, and 318, constructed on boards that plug into X processing slice 15 and Y processing slice 18, respectively, while portions such as slice ID generators 203 and 303 may reside external to the boards. XTIL 39 and YTIL 42 may also have various portions or all their logic constructed on boards that plug into X processing slice 33 and Y processing slice 36, respectively. These equivalents and alternatives are intended to be included within the scope of the present invention.

What is claimed is:

1. A computer system comprising:
   a first cable connecting unit (CCU) for connecting a first cable to said computer system;
   a first interface logic unit (ILU) for indicating to said computer system whether said first cable is connected to a first remote computer component, said first ILU including:
   a first cable detect signal generator, coupled to said first CCU, for generating a first continuous cable detect signal to be sent over said first cable;
   a first address signal generator, coupled to said first CCU, for generating a first address signal to be sent over said first cable, wherein said first address signal specifies a first address for said first remote computer component;
   a first slice identification (ID) signal generator, coupled to said first CCU, for generating a first slice ID signal to be sent over said first cable, wherein said first slice ID signal specifies a first slice ID for said first remote computer component;
   a first remote connection acknowledgement (RCA) signal receiver, coupled to said first CCU, for receiving a first RCA signal sent over said first cable; and
   a first remote connection status indicator, coupled to said first RCA signal receiver, including logic for issuing to said computer system, responsive to said first RCA signal, a first remote connection status signal according to a state of said RCA signal, wherein said state of said first RCA signal indicates whether said first remote computer component received said first continuous cable detect signal, said first address signal, and said first slice ID signal over said first cable;
   a second cable connecting unit (CCU) for connecting a second cable to said computer system; and a second ILU for indicating to said computer system whether said second cable is connected to a second remote computer component, said second ILU including:
- a second cable detect signal generator, coupled to said second CCU, for generating a second continuous cable detect signal to be sent over said second cable;
- a second address signal generator, coupled to said second CCU, for generating a second address signal to be sent over said second cable, wherein said second address signal specifies a second address for a second remote computer component;
- a second slice ID signal generator, coupled to said second CCU, for generating a second slice ID signal to be sent over said second cable; wherein said second slice ID signal specifies a second slice ID for said second remote computer component;
- a second RCA signal receiver, coupled to said second CCU, for receiving a second RCA signal sent over said second cable; and
- a second remote connection status indicator, coupled to said second RCA signal receiver, including logic for issuing to said computer system, responsive to said second RCA signal, a second remote connection status signal according to a state of said second RCA signal, wherein said state of said second RCA signal indicates whether said second remote computer component received said second continuous cable detect signal, said second address signal, and said second slice ID signal over said second cable.

2. The computer system of claim 1 further comprising a signal path coupling said first ILU to said second ILU.

3. The computer system of claim 2 wherein said computer system comprises a first computer processor and said first remote computer component comprises a second computer processor.

4. The computer system of claim 3 wherein said first computer processor and said second computer processor each comprise means for performing redundant operations.

5. A computer system comprising:
- a first computer component;
- a second computer component;
- a first cable having a first end and a second end;
- a first cable connecting unit (CCU), coupled to said first computer component, for connecting said first end of said first cable to said first computer component;
- a second CCU, coupled to said second computer component, for connecting said second end of said first cable to said second computer component;
- a first master ILU, included in said first computer component and coupled to said first CCU, including logic for issuing a first plurality of interrogation signals over said first cable to determine a status of a connection of said second end of said first cable to said second computer component, and including logic for indicating to said first computer component, responsive to a first reply signal received over said first cable, said status of said connection;
- a first target ILU, included in said second computer component and coupled to said second CCU, including logic for determining from said first plurality of interrogation signals received over said first cable whether said first end of said first cable is connected to said first computer component, and including logic for issuing said first reply signal over said first cable accordingly; and wherein said first plurality of interrogation signals includes:
- a first continuous cable detect signal communicated on a first signal path between said first master ILU and said first target ILU in said first cable,
- a first address signal communicated on a second signal path between said first master ILU and said first target ILU in said first cable,
- a first slice identification (ID) signal communicated on a third signal path between said first master ILU and said first target ILU in said first cable, and wherein said first reply signal includes:
- a first RCA signal communicated on a fourth signal path between said first master ILU and said first target ILU in said first cable.

6. The computer system of claim 5 wherein said first master ILU comprises:
- a first cable detect signal generator, coupled to said first CCU, for generating said first continuous cable detect signal to be sent over said first cable;
- a first address signal generator, coupled to said first CCU, for generating said first address signal to be sent over said first cable, wherein said first address signal specifies a first address for said first target ILU;
- a first slice ID signal generator, coupled to said first CCU, for generating said first slice ID signal to be sent over said first cable, wherein said first slice ID signal specifies a first slice ID for said first target ILU;
- a first RCA signal receiver, coupled to said first CCU, for receiving said first RCA signal sent over said first cable; and
- a first remote connection status indicator, coupled to said first RCA signal receiver, including logic for issuing to said first computer component, responsive to said first RCA signal, a first remote connection status signal according to a state of said first RCA signal, wherein said state of said first RCA signal indicates whether said second computer component received said first continuous cable detect signal, said first address signal, and said first slice ID signal over said first cable; and wherein said first target ILU comprises:
- a first cable detect signal receiver, coupled to said second CCU, for receiving said first continuous cable detect signal sent over said first cable,
- a first address signal receiver, coupled to said second CCU, for receiving said first address signal sent over said first cable,
- a first slice ID signal receiver, coupled to said second CCU, for receiving said first slice ID signal sent over said first cable, and
- a first RCA-generating logic circuit including logic for determining, responsive to said first cable detect signal, said first address signal, and said first slice ID signal, whether said first end of said first cable is connected to said first computer component, and including logic for generating said first RCA signal to be sent over said first cable accordingly.

7. The computer system of claim 6 further comprising:
- a third computer component;
- a fourth computer component;
- a second cable having a first end and a second end;
- a third cable CCU, coupled to said third computer component, for connecting said first end of said second cable to said third computer component;
- a fourth CCU, coupled to said fourth computer component, for connecting said second end of said second cable to said fourth computer component;

a second master ILU, included in said third computer component and coupled to said third CCU, including logic for issuing a second plurality of interrogation signals over said first cable to determine a status of a connection of said second end of said second cable to said fourth computer component, and including logic for indicating to said third computer component, responsive to a second reply signal received over said second cable, said status of said connection;

a second target ILU, included in said fourth computer component and coupled to said fourth CCU, including logic for determining from said second plurality of interrogation signals received over said second cable whether said first end of said second cable is connected to said third computer component, and including logic for issuing said second reply signal over said second cable accordingly; and wherein said second plurality of interrogation signals includes:

a second continuous cable detect signal communicated on a fifth signal path between said second master ILU and said second target ILU in said second cable, a second address signal communicated on a sixth signal path between said second master ILU and said second target ILU in said second cable, a second slice ID signal communicated on a seventh signal path between said second master ILU and said second target ILU in said second cable, and wherein said second reply signal includes:

a second RCA signal communicated on an eighth signal path between said second master ILU and said second target ILU in said second cable.

8. The computer system of claim 7 wherein:

said second master ILU comprises:

a second cable detect signal generator, coupled to said third CCU, for generating a second continuous cable detect signal to be sent over said second cable;

a second address signal generator, coupled to said third CCU, for generating a second address signal to be sent over said second cable, wherein said second address signal specifies a second address for said second target ILU;

a second slice ID signal generator, coupled to said third CCU, for generating a second slice ID signal to be sent over said second cable, wherein said second slice ID signal specifies a second slice ID for said second target ILU;

a second RCA signal receiver, coupled to said third CCU, for receiving said second RCA signal sent over said second cable; and a second remote connection status indicator, coupled to said second RCA signal receiver, including logic for issuing to said third computer component, responsive to said second RCA signal, a second remote connection status signal according to a state of said second RCA signal, wherein said state of said second RCA signal indicates whether said fourth computer component received said second continuous cable detect signal, said second address signal, and said second slice ID signal over said second cable; and wherein said second target ILU comprises:

a second cable detect signal receiver, coupled to said fourth CCU, for receiving said second continuous cable detect signal sent over said second cable;

a second address signal receiver, coupled to said fourth CCU, for receiving said second address signal sent over said second cable;

a second slice ID signal receiver, coupled to said fourth CCU, for receiving said second slice ID signal sent over said second cable; and second RCA-generating logic circuit including logic for determining, responsive to said second cable detect signal, said second address signal, and said second slice ID signal, whether said first end of said second cable is connected to said third computer component, and including logic for generating said second RCA signal to be sent over said second cable accordingly.

9. The computer system of claim 8 further comprising:

a ninth signal path coupling said first master ILU to said second master ILU; and a tenth communication path coupling said first target ILU to said second target ILU.

10. The computer system of claim 9 wherein:

said first computer component, said second computer component, said third computer component, said fourth computer component each comprise computer processors.

11. The computer system of claim 9 wherein:

said first computer processor and said third computer processor each comprise means for performing redundant operations; and said second computer processor and said fourth computer processor each comprise means for performing redundant operations.

12. The computer system of claim 11 wherein said first RCA-generating logic circuit comprises:

(a) a first address comparing circuit, coupled to said first address signal receiver and said tenth signal path, including logic for comparing said first address from said first address signal receiver with said second address received by said second address receiver and transmitted to said first target ILU over said tenth signal path, and including logic for generating a first comparison signal accordingly;

(b) a first slice ID verifying circuit, coupled to said first slice ID signal receiver, including logic for verifying that said first slice ID specifies said first target ILU, and including logic for generating a first slice verifying signal accordingly; and (c) a first RCA generator having a first input coupled to said first cable detect signal receiver, a second input coupled to said first address comparing circuit, and a third input coupled to said first slice ID verifying circuit, including logic for generating said first RCA signal responsive to said first cable detect signal, said first comparison signal, and said first slice verifying signal; and wherein said second RCA-generating logic circuit comprises:

(a) a second address comparing circuit, coupled to said second address signal receiver and said tenth signal path, including logic for comparing said second address from said second address signal receiver with said first address received by said first address receiver and transmitted to said second target ILU over said tenth signal path, and including logic for generating a second comparison signal accordingly;

(b) a second slice ID verifying circuit, coupled to said second slice ID signal receiver, including logic for verifying that said second slice ID specifies said second target ILU, and including logic for generating a second slice verifying signal accordingly; and.

(c) a second RCA generator having a first input coupled to said second cable detect signal receiver, a second input coupled to said second address comparing circuit, and a third input coupled to said second slice ID verifying circuit, including logic for generating said second RCA signal responsive to said second cable detect signal, said second comparison signal, and said second slice verifying signal.

13. The computer system of claim 12 further comprising:

a first bus driving circuit, coupled to said first RCA generator, for driving a first data bus and first address bus internal to said second computer component when said first RCA signal is asserted; and a second bus driving circuit, coupled to said second RCA generator, for driving a second data bus and second address bus internal to said fourth computer component when said second RCA signal is asserted.

14. The computer system of claim 10 wherein said first cable further comprises an eleventh signal path for communicating data signals between said first computer component and said second computer component; and wherein said second cable further comprises an twelfth signal path for communicating data signals between said third computer component and said fourth computer component.

15. The computer system of claim 11 wherein said first master ILU further comprises a first parity signal generator having a first input coupled to said first address signal generator, a second input coupled to said first slice ID signal generator and an output coupled to said first CCU, including logic for generating a first parity signal to be sent over said first cable responsive to said first address signal and said first slice ID signal;

wherein said first target ILU further comprises a first parity signal receiver, coupled to said second CCU, for receiving said first parity signal;

wherein said second master ILU further comprises a second parity signal generator having a first input coupled to said second address signal generator, a second input coupled to said second slice ID signal generator, an output coupled to said third CCU, including logic for generating a second parity signal to be sent over said second cable responsive to said second address signal and said second slice ID signal; and wherein said second target ILU further comprises a second parity signal receiver, coupled to said fourth CCU, for receiving said second parity signal.

16. The computer system of claim 15 wherein said first RCA-generating logic circuit comprises:

(a) a first address comparing circuit, coupled to said first address signal receiver and to said tenth signal path, including logic for comparing said first address from said first address signal receiver with said second address received by said second address receiver and transmitted to said first target ILU over said tenth signal path, and including logic for generating a first comparison signal accordingly;

(b) a first slice ID verifying circuit, coupled to said first slice ID signal receiver, including logic for verifying that said first slice ID specifies said first target ILU, and including logic for generating a first slice verifying signal accordingly;

(c) a first parity verifying circuit having a first input coupled to said first parity signal receiver, a second input coupled to said first address signal receiver, and a third input coupled to said first slice ID signal receiver, including logic for generating a third parity signal responsive to said first address signal and first slice signal, including logic for verifying that said first parity signal and said third parity signal are equivalent, and including logic for generating a first parity check signal accordingly; and (d) a first RCA generator having a first input coupled to said first cable detect signal receiver, a second input coupled to said first address comparing circuit, a third input coupled to said first slice ID verifying circuit, and a fourth input coupled to an output of said first parity verifying circuit, including logic for generating said first RCA signal responsive to said first cable detect signal, said first comparison signal, said first slice verifying signal, and said first parity check signal; and wherein said second RCA-generating logic circuit comprises:

(a) a second address comparing circuit, coupled to said second address signal receiver and to said tenth signal path, including logic for comparing said second address from said second address signal receiver with said first address received by said first address receiver and transmitted to said second target ILU over said tenth signal path, and for generating a second comparison signal accordingly;

(b) a second slice ID verifying circuit, coupled to said second slice ID signal receiver, including logic for verifying that said second slice ID specifies said second target ILU, and including logic for generating a second slice verifying signal accordingly; and (c) a second parity verifying circuit having a first input coupled to said second parity signal receiver, a second input coupled to said second address signal receiver, and a third input coupled to said second slice ID signal receiver, including logic for generating a fourth parity signal responsive to said second address signal and said second slice ID signal, including logic for verifying that said second parity signal and said fourth parity signal are equivalent, and for generating a second parity check signal accordingly;

(d) a second RCA generator having a first input coupled to said second cable detect signal receiver, a second input coupled to said second address comparing circuit, a third input coupled to said second slice ID verifying circuit, and a fourth input coupled to said second parity verifying circuit, including logic for generating said second RCA signal responsive to said second cable detect signal, said second comparison signal, said second slice verifying signal, and said second parity check signal.

17. The computer system of claim 12 wherein said first RCA generator comprises a first logic circuit for performing a first logical AND operation such that said first RCA signal is asserted when:

said first cable detect signal was received by said first cable detect receiver;

said first comparison signal indicates that said first address from said first address receiver corresponds to said second address from said second address receiver; and said first slice verifying signal indicates that said first slice ID specifies said first target ILU; and wherein said second RCA generator comprises a second logic circuit for performing a second logical AND operation such that said second RCA signal is asserted when:

said second cable detect signal was received by said second cable detect receiver;

said second comparison signal indicates that said second address from said second address receiver corresponds to said first address from said first address receiver; and said second slice verifying signal indicates that said second slice ID specifies said second target ILU.

18. The computer system of claim 16 wherein said first RCA generator comprises a first logic circuit for performing a first logical AND operation such that said first RCA signal is asserted when:

said first cable detect signal was received by said first cable detect receiver;

said first comparison signal indicates that first address from said first address receiver corresponds to said second address from said second address receiver; and said first slice verifying signal indicates that said first slice ID signal specifies said first target ILU;

said first parity check signal indicates that said first parity signal corresponds to said third parity signal; and wherein said second RCA generator comprises a second logic circuit for performing a second logical AND operation such that said second RCA signal is asserted when:

said second cable detect signal was received by said second cable detect receiver;

said second comparison signal indicates that said second address from said second address receiver corresponds to said first address from said first address receiver;

said second slice verifying signal indicates that said second slice ID specifies said second target ILU; and said second parity check signal indicates that said second parity signal corresponds to said fourth parity signal.

19. In a redundant computer system, a method of detecting if a cable is correctly coupled between a first computer component and a second computer component, said method comprising the steps of:

(a) generating a cable detect signal at said first computer component;

(b) generating an address signal at said first computer component, wherein said address signal specifies the address of a target computer component;

(c) generating a slice ID signal at said first computer component, wherein said slice ID signal specifies the slice ID of said target computer component;

(d) transmitting said cable detect signal, said address signal, and said slice ID signal over said cable to said second computer component;

(e) generating an RCA signal at said second computer component whose state is responsive to said cable detect signal, said address signal, and said slice ID signal, and whose state is asserted when said second computer component receives said cable detect signal, and when said second computer component coincides with said target computer component specified by said address signal and said slice ID signal;

(f) transmitting said RCA signal from said second computer component to said first computer component over said cable; and (g) determining, at said first computer component from said state of said RCA signal, whether said second computer component received said cable detect signal and whether said second computer component coincides with said target computer component.

* * * * *